US008876312B2

(12) United States Patent
Tan et al.

(10) Patent No.: US 8,876,312 B2
(45) Date of Patent: Nov. 4, 2014

(54) LIGHTING DEVICE AND APPARATUS WITH SPECTRAL CONVERTER WITHIN A CASING

(71) Applicant: Avago Technologies General IP (Singapore) Pte. Ltd., Singapore (SG)

(72) Inventors: Kheng Leng Tan, Penang (MY); Ju Chin Poh, Penang (MY); Keat Chuan Ng, Penang (MY); Chuan Hoe Chan, Perak (MY); Kwok Yuen Ng, Penang (MY); Kum Soon Wong, Kl (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 66 days.

(21) Appl. No.: 13/785,924

(22) Filed: Mar. 5, 2013

(65) Prior Publication Data

US 2014/0254127 A1    Sep. 11, 2014

(51) Int. Cl.
*F21V 9/16*    (2006.01)
*F21V 9/08*    (2006.01)

(52) U.S. Cl.
CPC ........................................ *F21V 9/08* (2013.01)
USPC ............. 362/84; 362/231; 257/620; 257/502; 257/503; 438/462; 438/113

(58) Field of Classification Search
USPC ..................... 362/231, 84; 257/502, 503, 620; 438/462, 29, 113, 114
See application file for complete search history.

(56) References Cited

U.S. PATENT DOCUMENTS

| 6,833,565 | B2 | 12/2004 | Su et al. | |
|---|---|---|---|---|
| 7,206,507 | B2 | 4/2007 | Lee et al. | |
| 7,576,478 | B2 * | 8/2009 | Hikmet | 313/110 |
| 8,232,117 | B2 | 7/2012 | Basin et al. | |
| 8,338,838 | B2 * | 12/2012 | Sun et al. | 257/88 |
| 2007/0291494 | A1 | 12/2007 | Galli | |
| 2008/0173884 | A1 * | 7/2008 | Chitnis et al. | 257/98 |
| 2009/0093075 | A1 * | 4/2009 | Chu et al. | 438/33 |
| 2009/0173958 | A1 * | 7/2009 | Chakraborty et al. | 257/98 |
| 2009/0173960 | A1 | 7/2009 | Martin et al. | |
| 2009/0179207 | A1 * | 7/2009 | Chitnis et al. | 257/88 |
| 2011/0031516 | A1 * | 2/2011 | Basin et al. | 257/98 |
| 2012/0187427 | A1 | 7/2012 | Chandra | |

OTHER PUBLICATIONS

Allen, Steven C. et al., "ELiXIR—Solid-State Luminaire With Enhanced Light Extraction by Internal Reflection", http://www.opticsinfobase.org/jdt/abstract.cfm?id-138243>, vol. 3, Issue 2 2007, 155-159.

(Continued)

*Primary Examiner* — Ali Alavi

(57) ABSTRACT

In one embodiment, a light-emitting device having a substrate, a casing, a plurality of light source dies, a plurality of spectral converters and a plurality of optical structures is disclosed. The spectral converters may be configured to spectrally adjust a portion of the light output of the light source die into a first and second converted spectral output that is substantially different from one another. In another embodiment, a system for illumination having a plurality of lighting assemblies has been disclosed. Each of the lighting assemblies comprises a light source die and a spectral converter. The spectral converter is configured to spectrally adjust the light output of the light source die so that the plurality of lighting assemblies are configured to emit substantially different spectral output. In yet another embodiment, a lighting apparatus having a primary spectral converter and a secondary spectral converter is disclosed.

20 Claims, 17 Drawing Sheets

(56) References Cited

OTHER PUBLICATIONS

Oh, Jeong R. et al., "Enhanced Forward Efficiency of $Y_3Al_5O_{12}:Ce^{3+}$ Phosphor From White Light-Emitting Diodes Using Blue-Pass Yellow-Reflection Filter", http://pbcp.kaist.ac.kr/src_paper/2009OpE_Cho.pdf>, vol. 17, Issue 9 Apr. 21, 2009, 7450-7457.

Su, Jung-Chieh et al., "Design and Fabrication of White Light Emitting Diodes With an Omnidirectional Reflector", http://www.opticsinfobase.org/ao/abstract.cfm?uri=ao-48-26-4942>, vol. 48, Issue 26 2009, 4942-4946.

Taguchi, Tsunemasa, "Recent Progress and Future Prospect of High-Performance Near-UV Based White LEDs—From ECO Lighting to Medical Application", http://144.206.159.178/ft/CONF/16435683/16435690.pdf>, vol. 7422, 2009.

* cited by examiner

LIGHTING DEVICE AND APPARATUS WITH SPECTRAL CONVERTER WITHIN A CASING

BACKGROUND

Light emitting diodes, or more commonly known as LEDs are gaining popularity for solid-state lighting. In the field of solid-state lighting, most of the light sources are white light.

Color rendering index (referred hereinafter as "CRI") is a quantitative measure of the ability of a light source to reproduce the colors of various objects faithfully in comparison with an ideal or natural light source. The International Commission on Illumination defines CRI as an effect of an illuminant on the color appearance of objects by conscious or subconscious comparison with their color appearance under a reference illuminant. Usually, light sources with a high CRI are desirable in color critical applications such as photography and cinematography. In the field of Solid State Lighting, light sources with higher CRI are more desirable because objects under light sources with high CRI may appear more natural to users.

On the other hand, the color temperature of a light source may be defined as the temperature of an ideal black body radiator that radiates light of comparable hue to that of the light source. The color temperature of a light source indicates the relative color appearance of the particular light source on a scale from "warmer" (more yellow/amber) to "cooler" (more blue) light. Color temperatures are generally given in Kelvin or K. Color temperatures over 5,000K are called cool colors (bluish white), while lower color temperatures (2,700-3,000 K) are called warm colors (yellowish white through red). Choices of color temperatures may depend on a user's taste or personal choice, and may differ from one person to another.

From manufacturing perspective, supplying light sources having different color temperatures and different CRI may be challenging. Typically binning may be required. In addition, the end products of any light sources may need to be divided into multiple classification or category that makes manufacturing less cost effective and complicated.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings are for illustrative purpose to assist understanding and may not be drawn per actual scale.

DETAILED DESCRIPTION

Figure 1A:
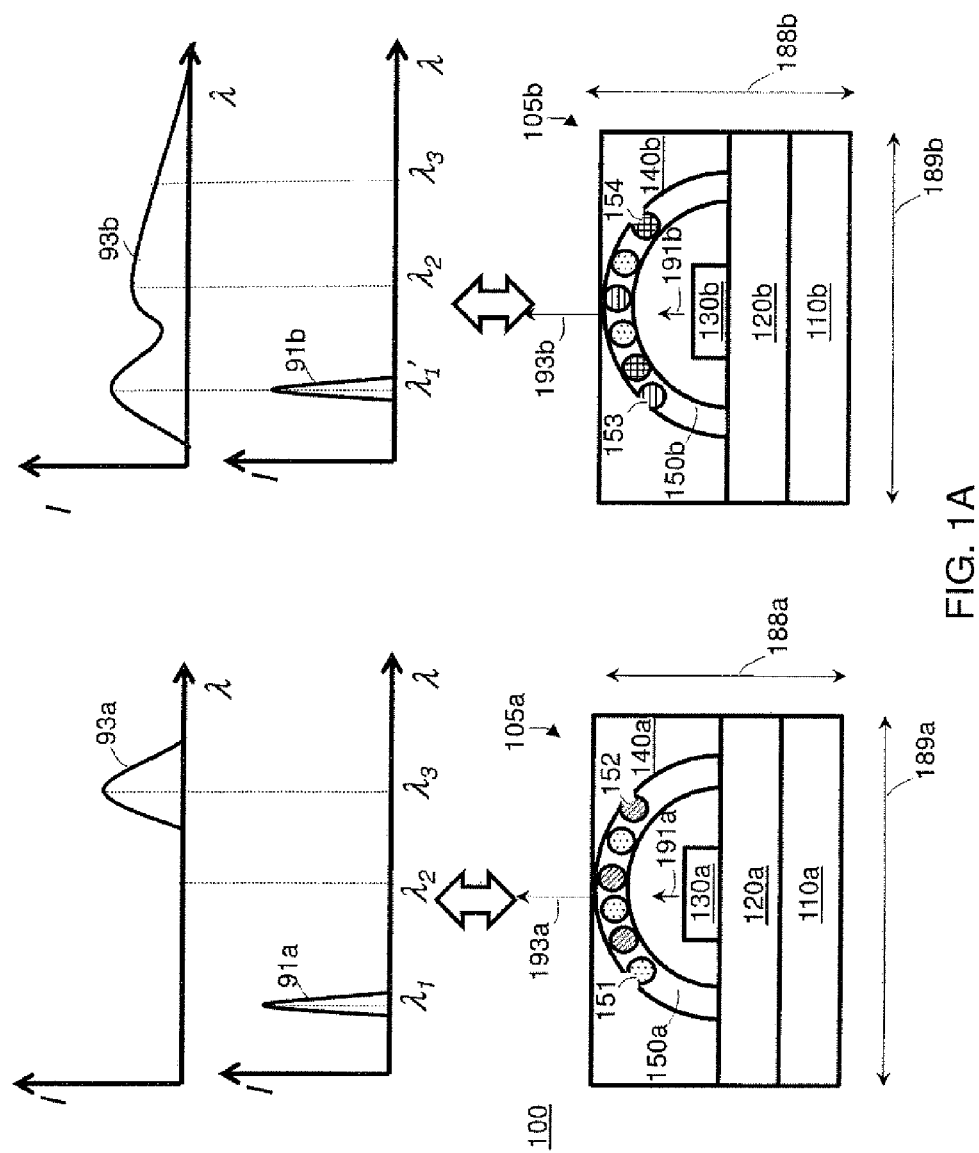
FIG. 1A shows an illustrative view of a system for illumination showing two lighting assemblies.

FIG. 1A illustrates a system 100 for illumination. The system 100 comprises a plurality of lighting assemblies 105a, 105b. The plurality of lighting assemblies 105a, 105b shown in FIG. 1A may be lighting fixtures or lighting apparatuses used for solid-state lighting. Alternatively, the lighting assemblies 105a, 105b may be packaged LEDs used for any general applications that require illumination. The discussion about the lighting assemblies 105a, 105b may be applicable to light-emitting devices in packaged LED form or lighting fixtures having an LED, either in die form or in packaged form. Throughout the specification and the claims, when one of the lighting apparatus, lighting assembly, light-emitting device and light source package is mentioned, all variations should be taken into consideration.

Each member of the plurality of lighting assemblies 105a, 105b may comprise a light source package having a respective form factor. The form factors may be substantially similar to one another. For example, one of the lighting assemblies 105a may have a width dimension 189a, and a height dimension 188a whereas another one of the lighting assemblies 105b may have a width dimension 189b and a height dimension 188b as illustrated in FIG. 1A. The lighting assemblies 105a, 105b may be substantially congruent. Hence, the width dimension 189a and the height dimension 188a of the lighting assembly 105a may be substantially similar to the width dimension 189b and the height dimension 188b of the lighting assembly 105b respectively. In another embodiment, the shape may be substantially similar but the actual size may differ by a constant multiplicand. A system 100 of lighting assemblies 105a, 105b having substantially similar form factors or feature size may be manufactured using the same or substantially similar equipment and/or methodology.

Referring to FIGS. 1A-1G, each member of the plurality of lighting assemblies 105a, 105b may comprise an optional heat dissipater 110a, 110b, a respective substrate or a body 120a, 120b, a respective light source die 130a, 130b, a respective casing 140a, 140b and a respective spectral converter 150a, 150b. The optional heat dissipater 110a, 110b may be configured to transmit heat generated in the respective light source die 130a, 130b to its surroundings. The optional heat dissipater 110a, 110b may be electrically or thermally coupled to the respective light source die 130a, 130b. The respective light source die 130a, 130b may be coupled to the substrate or the body 120a, 120b and may be configured to emit a respective source spectral output 191a, 191b. Both the source spectral outputs 191a and 191b may be substantially similar to human eyes. The spectral response of the source spectral outputs 191a and 191b are shown in the graphs 91a and 91b respectively.

The respective spectral converter 150a, 150b may be selected to adjust a respective portion of the respective source spectral output 191a, 191b into a respective converted spectral output 193a, 193b. The spectral response of the converted spectral outputs 193a and 193b are shown in graphs 93a, 93b respectively, which show horizontal spectral wavelength ("Lambda") axes and vertical spectral intensity ("I") axes. The spectral converters 150a and 150b may be selected to be different from one another, and may be selected to adjust the source spectral outputs 191a and 191b differently into converted spectral outputs 193a and 193b that may be substantially dissimilar to human eyes.

More specifically, the spectral converters 150a and 150b may be formed within the respective casing 140a, 140b and may be arranged proximate to the respective light source die 130a, 130b. As shown in FIG. 1A, each of the spectral converters 150a and 150b may comprise a respective set of a plurality of spectral converting materials 151-154. The sets have a plurality of corresponding members of substantially different spectral converting materials 151-154. The spectral converters 150a and 150b may be selected to be different from one another, and may be selected to adjust the portions of the source spectral outputs 191a and 191b differently. One way to do this may be by using different compositions or amounts of spectral converting materials 151-154.

In addition, each of the spectral converting materials 151-154 may be made from substantially phosphorescent materials, substantially fluorescent materials, or color pigments or combinations thereof. The spectral converting materials 151-154 may include at least one selected from a group consisting of substantially phosphorescent materials, substantially fluorescent materials, color pigments and combinations thereof. The spectral converting materials 151-154 may also be any other similar materials that may change at least portions of the source spectral outputs 191a, 191b of a light source die 130a, 130b such as by absorbing light having a specific wavelength, or by shifting a specific predetermined wavelength, or any combinations of the above. The spectral converting materials 151-154 may change at least portions of the source spectral outputs by at least one selected from a group consisting of substantially absorbing light having a specific and/or predetermined wavelength, by shifting a specific and/or predetermined wavelength, and combinations thereof.

Figure 1C:
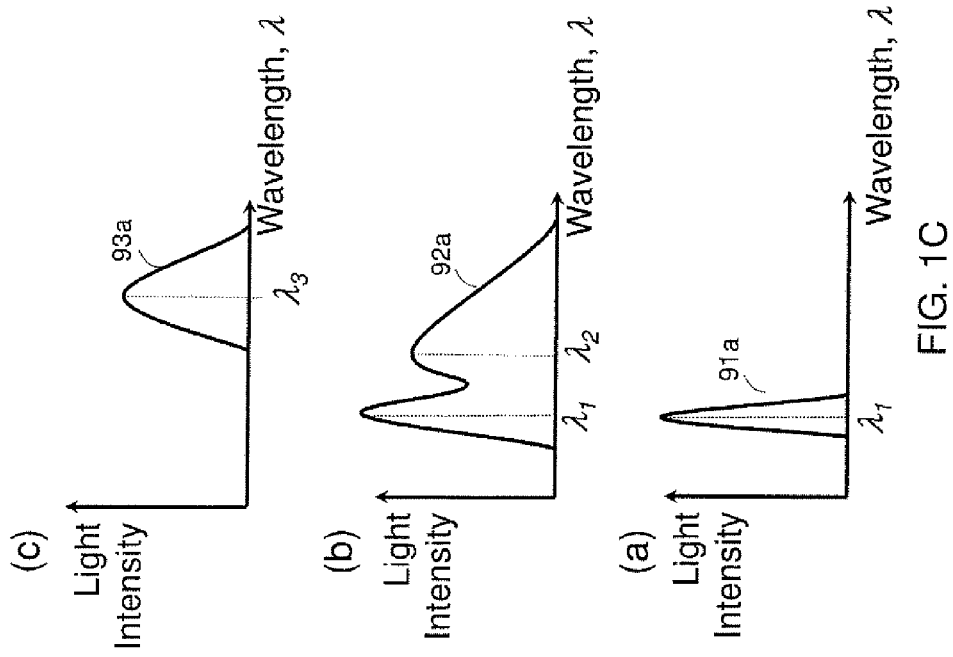
FIG. 1C illustrates spectral response of the respective stages of the converted spectral output 191a-193a shown in FIG. 1B.
Figure 1B:
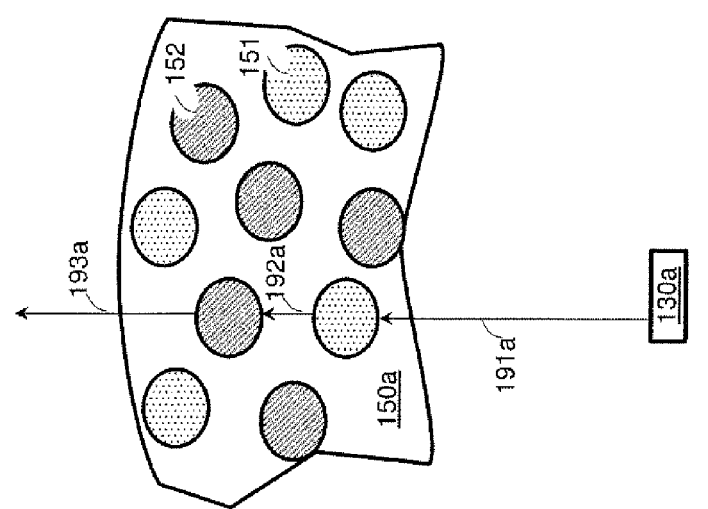
FIG. 1B illustrates how spectral converting materials may be configured to adjust the source spectral outputs.

For example, the source spectral outputs 191a and 191b may have primary peak wavelengths $\lambda_1$ and $\lambda_1'$ of approximately 450 nm (nano-meters) and approximately 451 nm respectively as shown in the solid lines graph, which show horizontal spectral wavelength ("Lambda") axes and vertical spectral intensity ("I") axes. Although the primary wavelengths differ from each other by approximately 1 nm, visually the source spectral output 191a, 191b may look similar. Visual appearance for both the source spectral outputs 191a and 191b may be light of predominantly similar color, for example blue, to human eyes. The converted spectral output 193a of the lighting assembly 105a may be predominantly red color as illustrated by the graph 93a having a single converted peak wavelength $\lambda_3$. On the other hand, the lighting assembly 105b may have a converted spectral output 193b of white light having a major peak wavelength that is substantially similar to the primary peak wavelength $\lambda_1$, as well as a secondary peak wavelength $\lambda_2$ at approximately 540 nm. FIGS. 1A-1C illustrate how the spectral converting materials 151-154 work to adjust the source spectral output 191a. More specifically, FIG. 1B illustrates how the spectral converting materials 151-152 work and FIG. 1C illustrates spectral response of the respective graphs 91a, 92a, and 93a of the spectral outputs 191a, 192a and 193a.

For example, referring to FIG. 1B, the spectral converting material 151 may be yellow phosphor that may be configured to convert a blue light into white light. The spectral converting material 151 may be configured to convert the source spectral output 191a, a blue light having narrow band spectral response 91a with primary peak wavelength $\lambda_1$, into an intermediate converted spectral output 192a. As shown in FIG. 1C, the spectral graph 92a of the intermediate converted spectral output 192a may be a broad spectrum graph 92a of white light. The intermediate converted spectral output 192a may have primary peak wavelength 2 and a secondary peak wavelength $\lambda_2$. The intermediate converted spectral output 192a may then be transmitted through the spectral converting material 152 that may be a red pigment for example. The spectral converting material 152 may be configured to absorb all light except red light. As a result, the converted spectral output 193a may have a narrow band spectral 93a having a converted peak wavelength $\lambda_3$ in the red light region of approximately 620 nm. Referring to FIG. 1A and FIG. 1C, the primary peak wavelength $\lambda_1$ may be around approximately 450 nm; the secondary peak wavelength $\lambda_2$ may be approximately 540 nm whereas the converted peak wavelength $\lambda_3$ may be around approximately 620 nm.

Figure 1D:
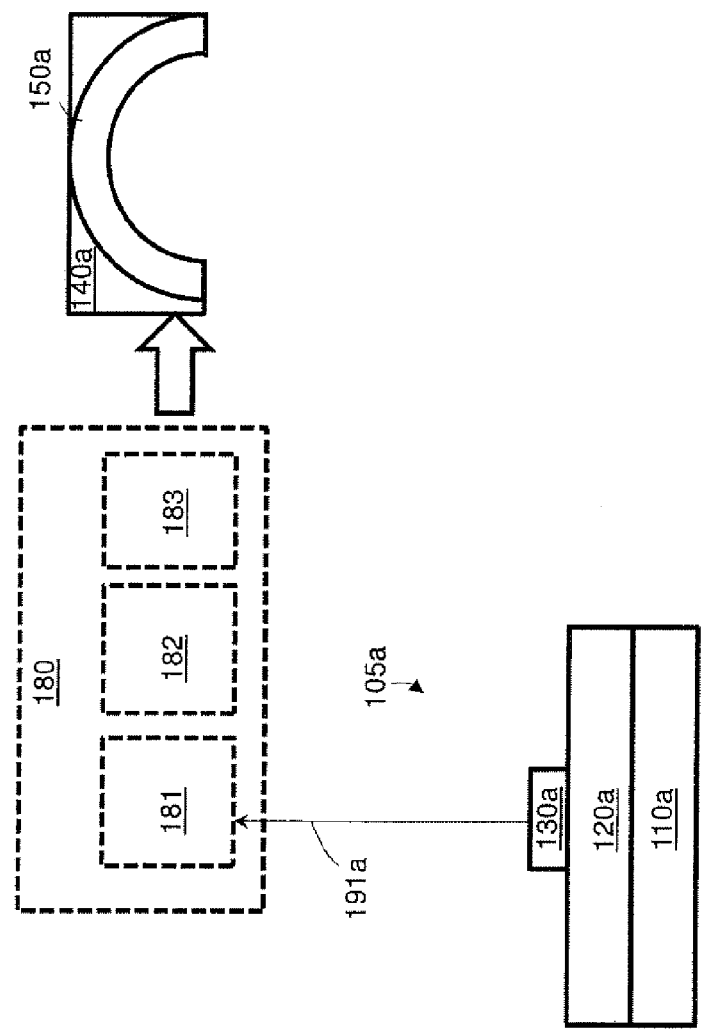
FIG. 1D illustrates how the spectral converter may be formed.

FIG. 1D illustrates how the spectral converter 150a may be formed using equipment 180. First, the light source die 130a may be assembled on the respective substrate 120a pre-manufactured together with the optional heat dissipater 110a. Next, the light source die 130a may then be configured to emit the source spectral output 191a which may be measured using a sensor 181. A processor 182 may be employed to process the sensor output, and to determine types and amount of the spectral converter 150a required. Subsequently, a dispenser 183 may be employed to dispense the respective spectral converter 150a into the casing 140a. In one embodiment, the respective spectral converter 150a may be laser printed or formed on a surface of the casing 140a. In another embodiment, the spectral converter 150a may be mixed with a transparent encapsulant which may be then be molded or casted together to form the casing 140a.

Figure 1E:
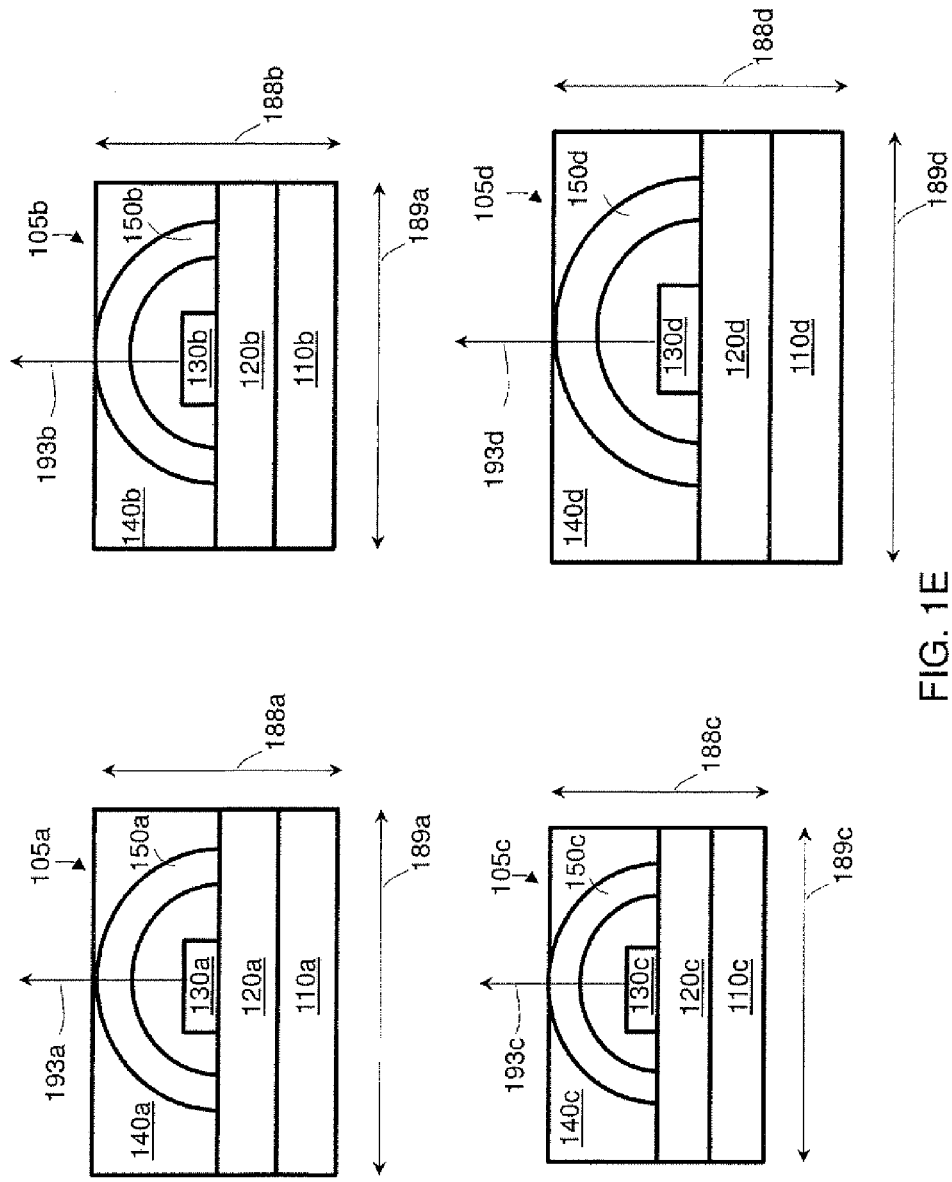
FIG. 1E illustrates a system of lighting assemblies having same or similar form factor.

FIG. 1E illustrates a system 100 of lighting assemblies 105a-105d having same or substantially similar form factor. Each of the lighting assemblies 105a-105d may comprise a respective optional heat dissipater 110a-110d, a respective body 120a-120d, a respective light source die 130a-130d, a respective casing 140a-140d and a respective spectral converter 150a-150d For example, the lighting assemblies 105a and 105b may be substantially congruent. The form factor of the lighting assembly 105a may be substantially similar to the lighting assembly 105b with the height dimension 188a substantially similar to the height dimension 188b and the width dimension 189a substantially similar to the width dimension 189b. Other lighting assemblies 105c and 105d may have substantially similar form factor but without having the same feature size.

For example, the lighting assembly 105c may have substantially similar form factor with the form factor of the lighting assembly 105a but having a feature size that is 80% of the feature size of the lighting assembly 105a. Hence, height dimension 188c may be 80% of the height dimension 188a and the width dimension 189c may be 80% of the width dimension 189a. Moreover, the lighting assembly 105d may have substantially similar form factor to the lighting assembly 105a but having a feature size that is 30% larger. Hence, the height dimension 188d may be 30% larger than the height dimension 188a whereas the width dimension 189d may be 30% larger than the width dimension 189a. By having substantially similar form factors, the lighting assemblies 105a-105d may be assembled using substantially similar methodology and/or equipment, but having different spectral converters 150a-150d to produce substantially dissimilar converted spectral outputs 193a-193d. The converted spectral outputs 193a-193d will be explained further with reference to FIG. 1F and FIG. 1G.

Figure 1F:
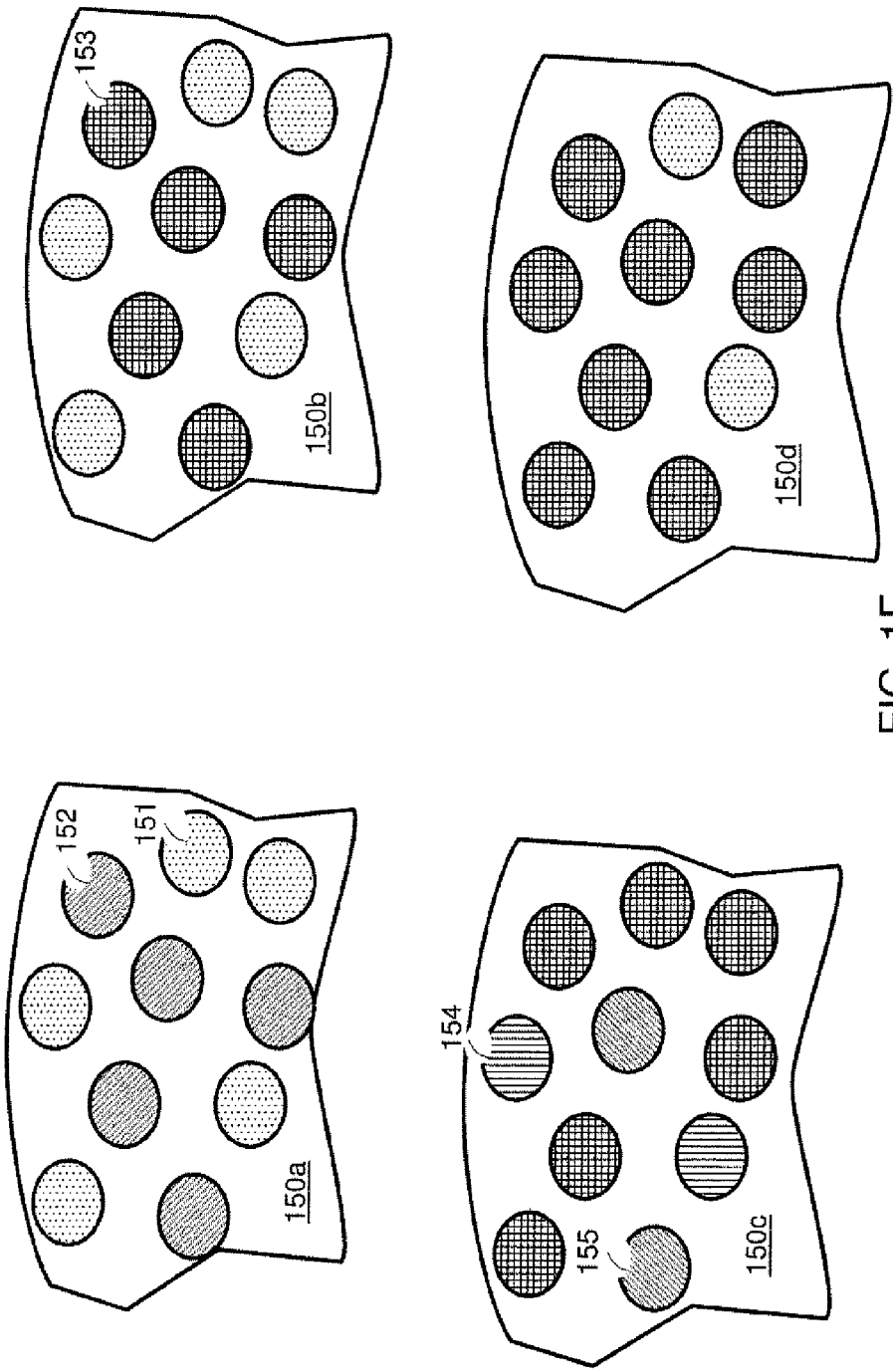
FIG. 1F illustrates the respective spectral converting materials for the lighting assemblies shown in FIG. 1E.
Figure 1G:
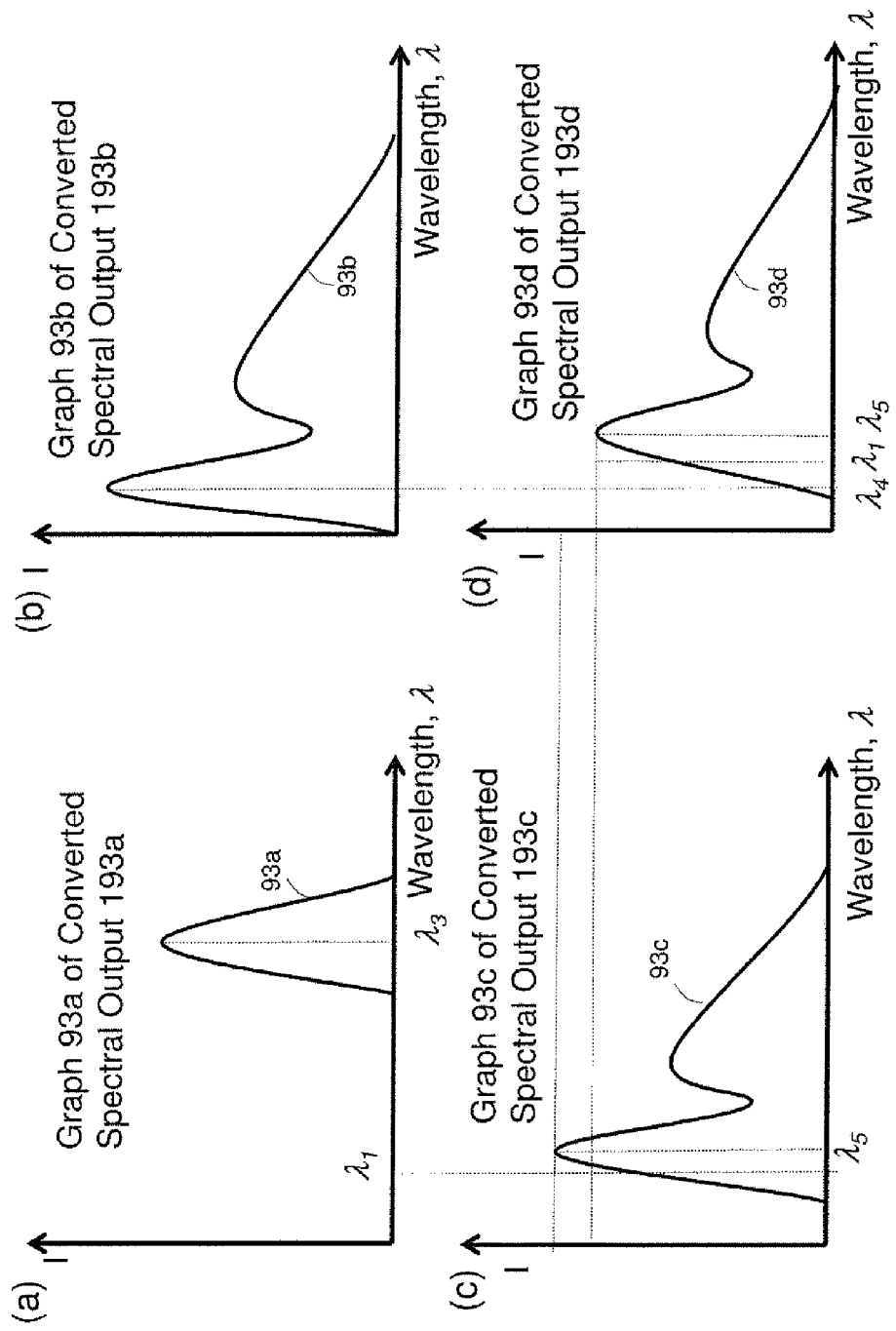
FIG. 1G shows graphs illustrating various converted spectral outputs for the lighting assemblies shown in FIG. 1E.

FIG. 1F illustrates the respective spectral converting materials 151-154 of the spectral converters 150a-150d of the lighting assemblies 105a-105d shown in FIG. 1E. FIG. 1G illustrates graphs 93a-93d of the converted spectral outputs 193a-193d for the lighting assemblies 105a-105d shown in FIG. 1E. FIG. 1G uses solid lines in spectral summation graphs, which show horizontal spectral wavelength ("Lambda") axes and vertical spectral intensity ("I") axes.

Referring to FIG. 1F, the corresponding spectral converters 150b and 150d may comprise at least one common spectral converting material 151, 153 that may be present in the sets in substantially different amounts. For example, both the spectral converters 150b and 150d may comprise yellow phosphor 151 and red phosphor 153 but in substantially differing amounts. Referring to FIGS. 1F and 1G, both of the converted spectral outputs of 193b and 193d may be broad spectrum but having graphs 93b and 93d that may look substantially dissimilar. The converted spectral output 193d may look substantially more reddish than the converted spectral output 193b due to having more components of red phosphor 153. The peak wavelength $\lambda_5$ of the converted spectral output 193d may be slightly larger than the primary peak wavelength $\lambda_4$ of the converted spectral output 193b.

The behavior of the converted spectral output 193a has been explained in FIG. 1B. The spectral converters 150a and 150b may be selected to adjust the portions of the source spectral outputs 191a-191d differently, so that the converted spectral outputs 193a-193d may have peak spectral components with peak wavelengths that are substantially different from one another. In addition, each of the spectral converters 150a-150d may comprise a plurality of spectral converting materials 151-155 that may be responsive to light of different wavelength respectively.

For example the spectral converting material 151 may be a red color pigment responsible for red light whereas the spectral converting material 155 may be a blue color pigment responsible for blue light. The spectral converting material 154 may be a fluorescence material. The yellow phosphor 152 and the red phosphor 153 may be similar in the way that both are configured to produce broad spectrum white light. However, the "white light" by the different phosphor 152-153 may be substantially different because one may be reddish white while the other may be yellowish white. Due to the difference in quantity or composition of the spectral converters 150a-150d, the peak wavelengths $\lambda_1$, $\lambda_3$, $\lambda_4$, and $\lambda_5$ illustrated in FIG. 1G may be substantially different from one and another.

Referring to FIGS. 1E-1G, the spectral converters 150a-150d may be selected to adjust the portions of the source spectral outputs 191a-191d differently, so that the converted spectral outputs 193a-193d may have substantially similar peak spectral components with amplitudes that are substantially different from one another. For example, due to the presence of the blue pigment 155 and the red pigment 151 in the spectral converter 150c, the graph 93d may have similar peak spectral component compared to the spectral output of 193c. However, the graph 93d may have relatively smaller amplitudes compared to the graph 93c because some components of the spectral outputs 193c are absorbed by the color pigments 151 and 153.

Figure 2A:
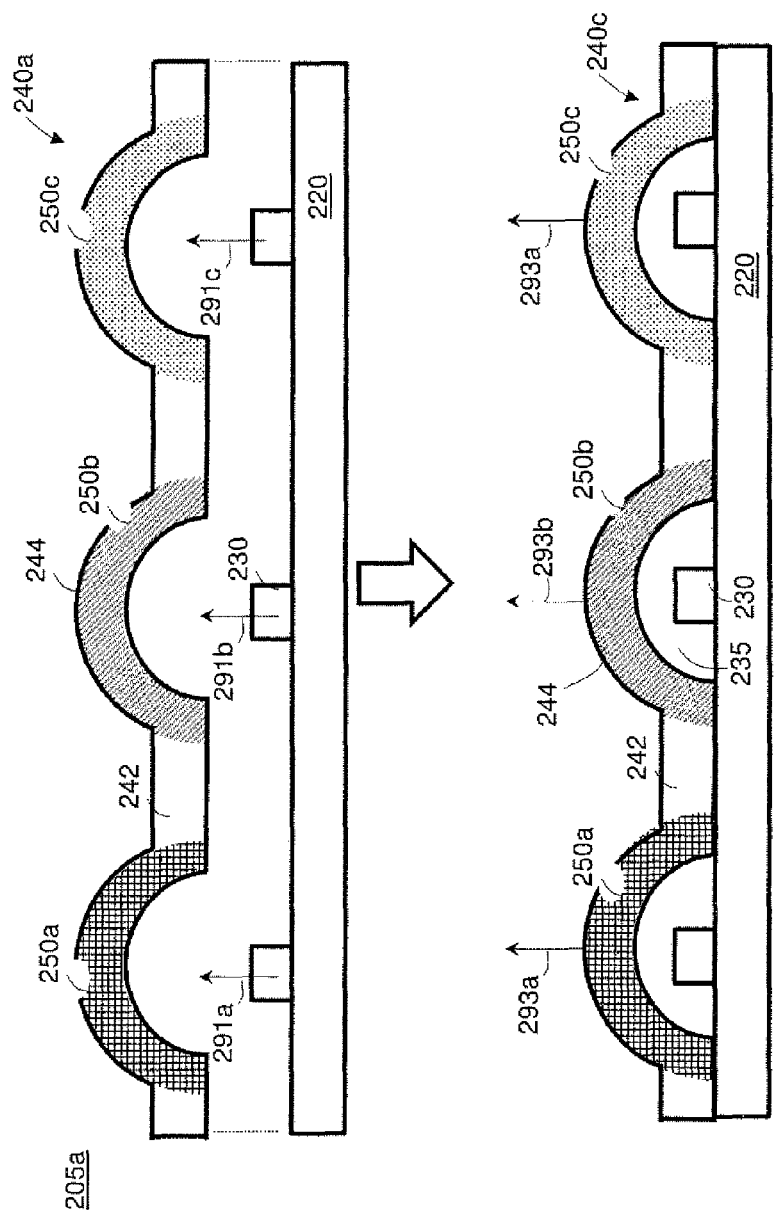
FIGS. 2A and 2B show various views of a system for illumination.
Figure 2B:
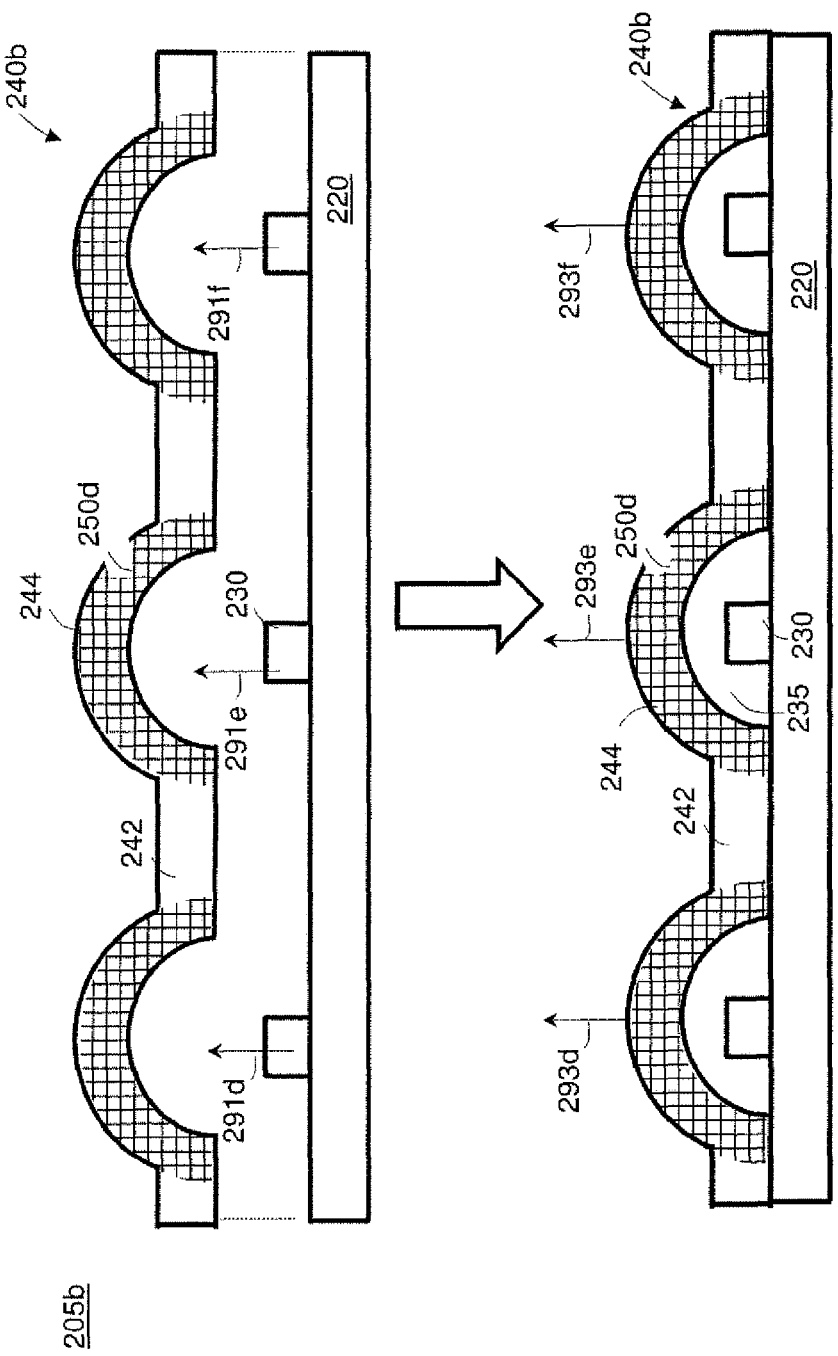

FIGS. 2A-2B show various views of a system 205a, 205b for illumination. More specifically, FIGS. 2A-2B illustrate cross sectional views of the system 205a, 205b having two light-emitting devices 205a-205b. The two light-emitting devices 205a-205b may be lighting apparatuses for solid-state lighting. The two light-emitting devices 205a-205b may have substantially similar form factor. Referring to FIG. 2A, the respective light-emitting device 205a may comprise a substrate 220, a plurality of light source dies 230, a casing 240a and a plurality of spectral converters 250a. The plurality of light source dies 230 may be LED dies, laser diode dies, or other light source dies capable of emitting light. The plurality of light source dies 230 may be attached to the substrate 220 through die attach method. The light-emitting device 205a may comprise one type of light source dies 230 and therefore, all source spectral outputs 291a-291c emitted from the plurality of light source dies 230 may be substantially similar. In other embodiment, where substantially different types or substantially different groupings (e.g. bins) of light source dies 230 are used, the source spectral outputs 291a-291c may be substantially dissimilar.

The "substrate" 220 as used herein in reference to a component of a light-emitting device 205a refers to a respective primary structure 220, which provides structural support for other components of the light emitting device 205a. In the embodiment shown in FIG. 2A, the substrate 220 may be a printed circuit board (referred hereinafter as "PCB"). In another embodiment, the substrate 220 may be a molded lead frame having a respective integral single piece body 220 encapsulating electrically conductive leads (not shown). The integral single piece body 220 may be formed using an opaque material such as Polyphthalamide (herein after PPA), Polyamide or Epoxy resin encapsulant like MG 97, plastic and other similar material. The body 220 may be formed encapsulating or surrounding the plurality of leads (not shown) using an injection molding process or other known process. Alternatively, the body 22 may be pre-formed and subsequently assembled to form the light-emitting device 205a. The substrate 220 may be highly reflective, or coated with a reflective material. For example, a light-emitting device 205a having a white PPA may achieve reflectivity of more than 90%.

The casing 240a may comprise a plurality of optical structures 244 and a substantially flat portion 242. The optical structures 244 may be configured to bend light rays. For example, the optical structures 244 may comprise a lens in one embodiment. The substantially flat portion 242 may be substantially transparent. In the embodiment shown in FIG. 2A, the substantially flat portion 242 may allow light to transmit through without attenuating the light substantially. This may be advantageous as light loss may be minimal. However, in another embodiment, the substantially flat portion 242 may substantially attenuate light and the substantially flat portion 242 may have transmissivity of less than approximately 30%. Attenuating light using the flat portion 242 may be advantageous in terms of isolating light from different light source dies 230.

Each optical structure 244 may comprise a cavity 235 with at least one light source die 230 located within the cavity 235. Each member of the optical structures 244 may be configured to enclose at least one of the plurality of light source dies 230 within the cavity 235 such that the respective source spectral output 291a-291c from the at least one of the light source dies 230 may be transmitted substantially through the respective optical structure 244. In other words, each member of the plurality of light source dies 230 may be optically coupled to one of the plurality of optical structures 244 respectively.

The casing 240a may be removeably attachable to the substrate 220 and when being fixed on the substrate 220, the casing 240a may enclose at least partially the plurality of light source dies 230 as shown in FIG. 2A. The plurality of spectral converters 250a-250c may be formed within the optical structures 244 of the casing 240a. The plurality of spectral converters 250a-250c may be optically coupled to, but distanced away from, the plurality of light source dies 230.

Referring to FIG. 2A, the plurality of spectral converters 250a-250c may be configured to adjust the substantially similar source spectral outputs 291a-291c into at least a first converted spectral output 293a. The spectral converters 250a-250c may be configured to adjust the substantially similar source spectral outputs 291a-291c into additional converted spectral outputs 293b-293c that may be substantially different from each other and may be substantially different from the first converted spectral output 293a. The number of additional converted spectral outputs 293b-293c may vary and on some occasions, there may be more than ten different additional converted spectral outputs 293-293c.

Referring to FIGS. 2A-2B, the system 205a, 205b may comprise at least one additional light-emitting device 205b in addition to the light-emitting device 205a. The at least one additional light-emitting device 205b may comprise a substrate 220 and a plurality of light source dies 230 substantially similar to the light-emitting device 205a, but may comprise a different casing 240b with spectral converters 250b different from the spectral converter 250a. For applications where different light outputs are desired, the converted spectral outputs 293d-293f may be obtained by replacing the casing 240a with an alternative casing (not shown in FIG. 2A). Such alternative casing may be substantially similar to the casing 240b shown in FIG. 2B. Hence, the casing 240b shown in FIG. 2B may be an alternative casing 240b, which may be an alternative to the casing 240a shown in FIG. 2A, for the light-emitting device 205a shown in FIG. 2A.

The plurality of light source dies 230 in the light-emitting device 205b and the plurality of light source dies 230 in the light-emitting device 205a may belong to the same type of die. In such case, the source spectral outputs 291d-291f and 291a-291c may be substantially similar. However, the casing 240b may comprise a substantially different spectral converter 250d compared to the spectral converters 250a-250c as shown in FIGS. 2A-2B. Therefore, the converted spectral output 293d-293f may be substantially different from the converted spectral output 293a-293c shown in FIG. 2A. In the embodiment shown in FIG. 2B, the converted spectral outputs 293d-293f may be substantially similar to each other as a common spectral converter 250d may be used in the embodiment shown in FIG. 2B.

Figure 2C:
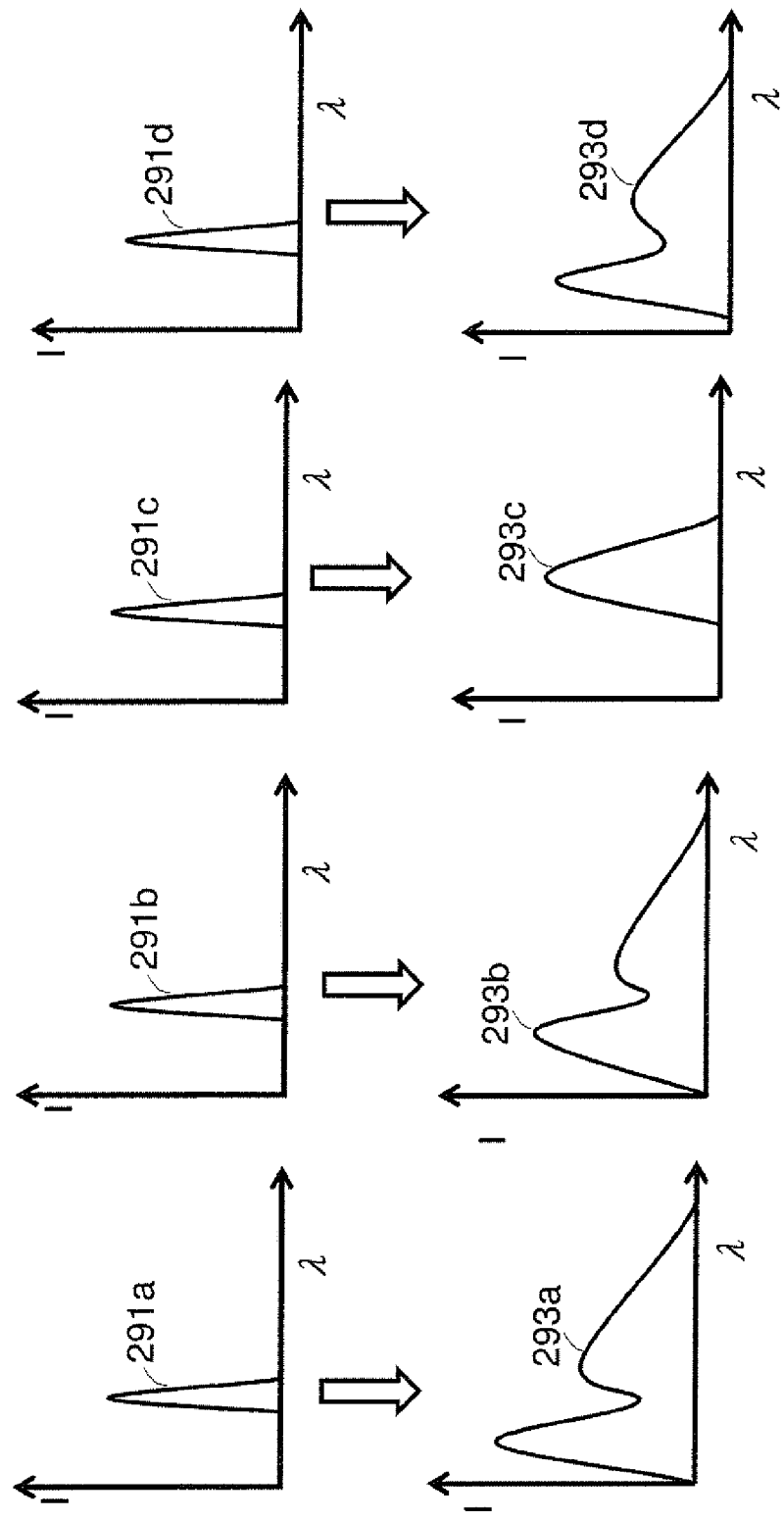
FIG. 2C illustrates graphs showing source spectral outputs and converted spectral outputs.

FIG. 2C illustrates the source spectral outputs 291a-291d and the converted spectral outputs 293a-293d, both shown in solid lines in spectral summation graphs, which show horizontal spectral wavelength ("Lambda") axes and vertical spectral intensity ("I") axes. In the graphs shown in FIG. 2C, the source spectral outputs 291e, 291f and the converted spectral outputs 293e, 293f are omitted because the source spectral outputs 291e, 291f and the converted spectral outputs 293; 293f are substantially similar to the source spectral output 291d and the converted spectral output 293d respectively. As can be seen in FIG. 2C, the source spectral outputs 291a-291d may be substantially similar but the converted spectral outputs 293a-293d may be substantially dissimilar to each other due to the use of substantially different spectral converters 250a-250d.

In some embodiments, the spectral converters 250a-250d may be located in the casings 240a-240b. Locating the spectral converters 250a-250d in the casing 240a-240b may provide several advantages. For example, the spectral converters may be less susceptible to affects from heat generated by the light source dies 230. In addition, the output of the light-emitting devices 205a-205b may be changed by removably replacing the respective casings 240a-240b. When the casing 240b shown in FIG. 2B is optically coupled to the light source dies 230 of the light-emitting device 205a shown in FIG. 2A, such light-emitting device 205a with replaced casing 240b may be configured to produce the converted spectral outputs 293d-293f shown in FIG. 2B. The casings 240a and 240b may be configured with substantially similar form factor, so that the casings 240a and 240b may be substantially interchangeable.

Figure 2D:
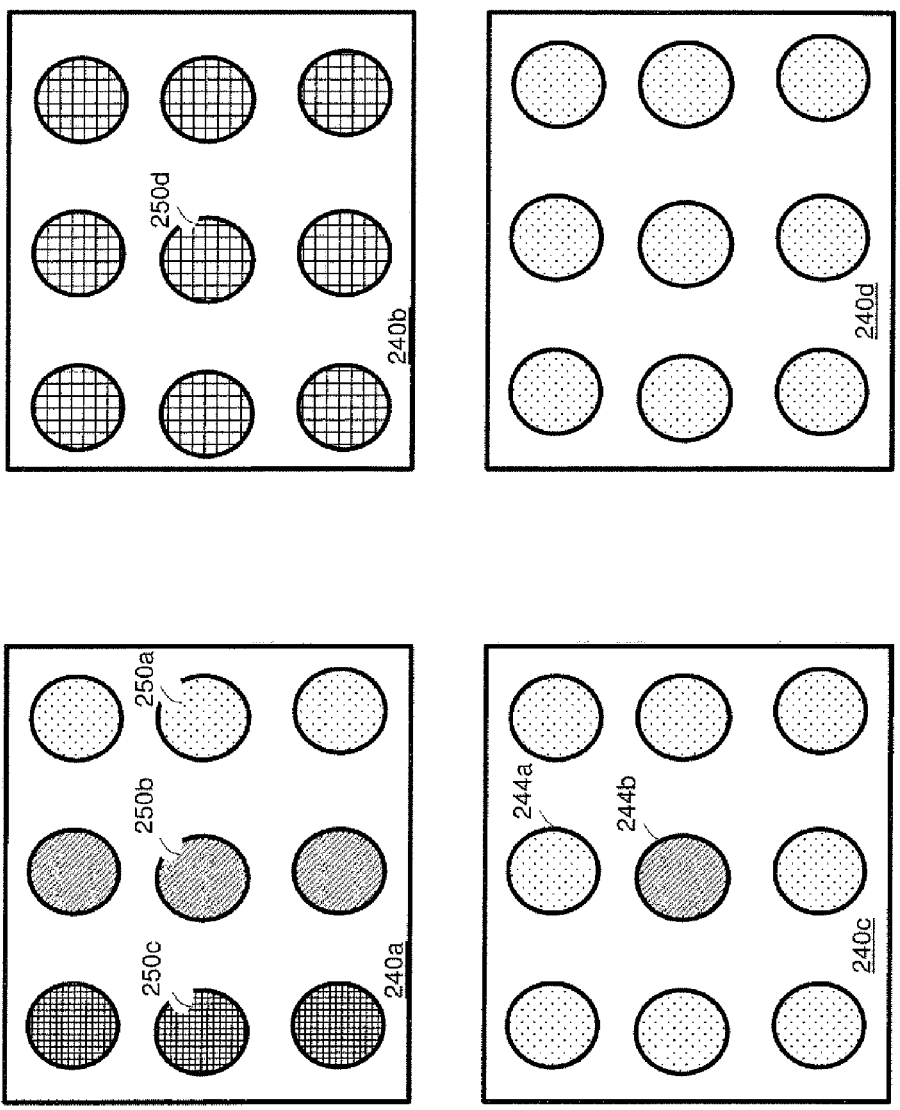
FIG. 2D illustrates top views of the casings shown in FIGS. 2A-2B having different spectral converters and top views of alternative casings.

Use of alternative casings with light-emitting device 205a may be expanded beyond just the one alternative casing 240b shown in FIG. 2B. More additional alternative cases may be used with light-emitting device 205a. For example, in FIG. 2D, in addition to casing 240a and alternative casing 240b, there are also shown further additional alternative casings 240c and 240d, which may likewise be used with light-emitting device 205a. In particular, FIG. 2D shows top views of casing 240a and alternative casing 240b (already discussed with reference to FIGS. 2A and 2B) and further shows top views of further additional alternative casings 240c and 240d. As shown in FIG. 2D, further additional alternative casings 240c and 240d have substantially different spectral converters 250c and 250d. The spectral converters 250a-250d may be arranged in matrix as shown in FIG. 2D. The casing 240a may comprise three different types of spectral converters 250a-250c with each type of the spectral converters 250a-250c being arranged in the same column. Having many different spectral converters 250a-250c may be advantageous because this may increase color rendering index of the light-emitting device 205a.

As shown by the casings 240b and 240d in FIG. 2D, each of the casings 240b and 240d may comprise a single type of spectral converter 250d and 250a respectively. For example, the casing 240b may comprise yellow phosphor 250d and may be configured to produce cool color white light, whereas the casing 240d may comprise red phosphor and may be configured to produce warm color white light. By substituting the casing 240b with the casing 240d, the output of the light-emitting device 205a may be changed from cool white to warm white without replacing the entire light-emitting device 205a. As the casings 240b and 240d may be removeably attachable to the substrate 220, the process of changing color point may be performed with limited effort.

The casing 240c may be predominantly configured to produce cool color white light using the spectral converter 250a. However, additional colors may be desirable in some circumstances. One example may be to increase color rendering index. For this type of applications, the casing 240c may have a plurality of primary optical structures 244a with similar type of spectral converters 250a and an additional secondary optical structure 244b with a different type of spectral converter 250b. The plurality of primary optical structures 244a may contribute towards a majority amount of the light emitted from the light-emitting device 205a. As shown in FIG. 2D, the casing 240c may have more numbers of the primary optical structures 244a than the secondary optical structure 244b. However, in another embodiment, the light emitting device 205c may have one primary optical structure 244a, which may be coupled to a relatively brighter light source die.

Figure 2E:
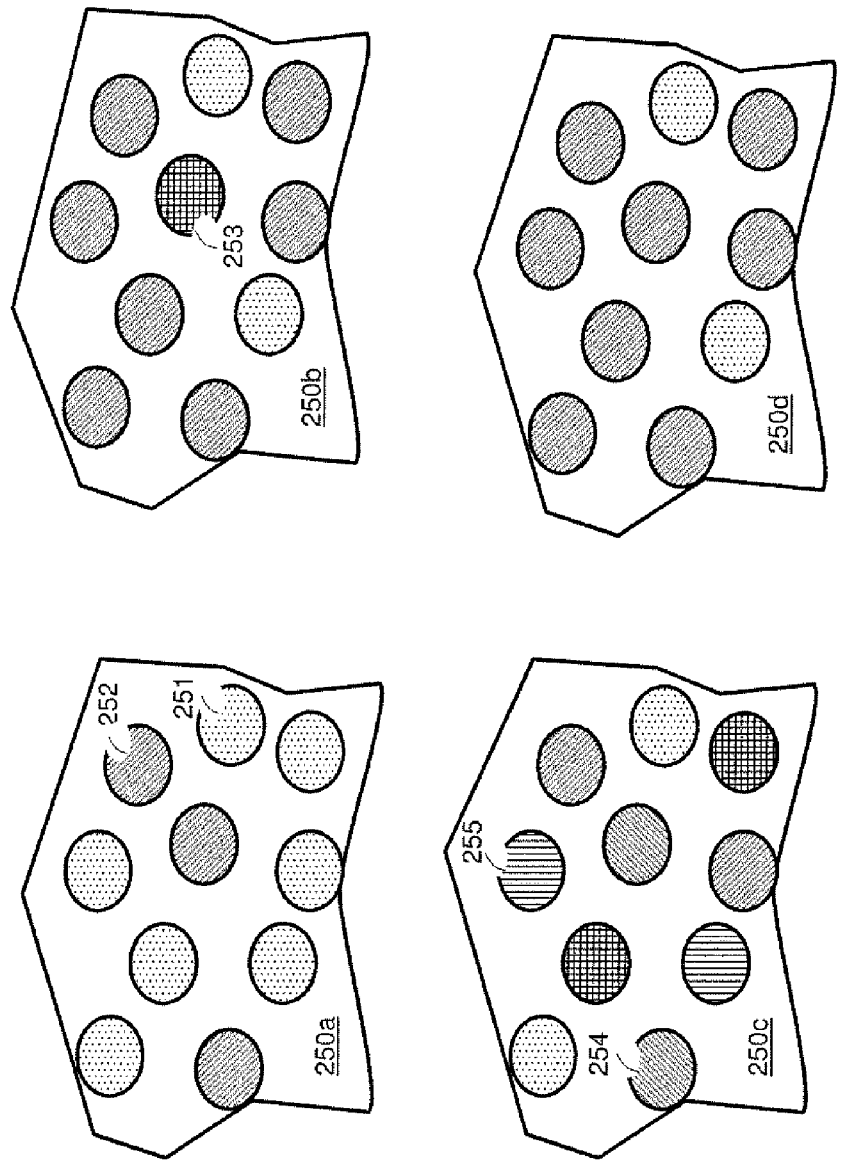
FIG. 2E shows an illustrative view of the spectral converting material for different spectral converters shown in FIG. 2A.

The spectral converters 250a-250d may comprise a plurality of spectral converting materials 251-255. FIG. 2E shows an illustrative view of the spectral converting material 251-255 in different spectral converters 250a-250d shown in FIG. 2D. The spectral converting material 251-255 may comprise a fluorescent material, a phosphorescent material, a color pigment material, a wavelength converting material such as phosphor or any other similar material or it's combination that may be configured to adjust spectral contents of the light. Each spectral converter may comprise one or more such spectral converting material 251-255 that may be present in substantially differing respective amounts in each member of the spectral converters 250a-250d.

For example, all of the spectral converters 250a-250c may comprise one common spectral converting material 251 but the spectral converting material 251 in each of the spectral converters 250a-250c may be present in substantially different amounts. The spectral converters 250a and 250d may comprise similar components of the spectral converting material 251-252 but as shown in FIG. 2E, the spectral converting materials 251-252 may be present in different ratios. In addition, the spectral converting material such as 253-254 having color pigments may be configured to adjust light with respect to a single color.

Figure 3A:
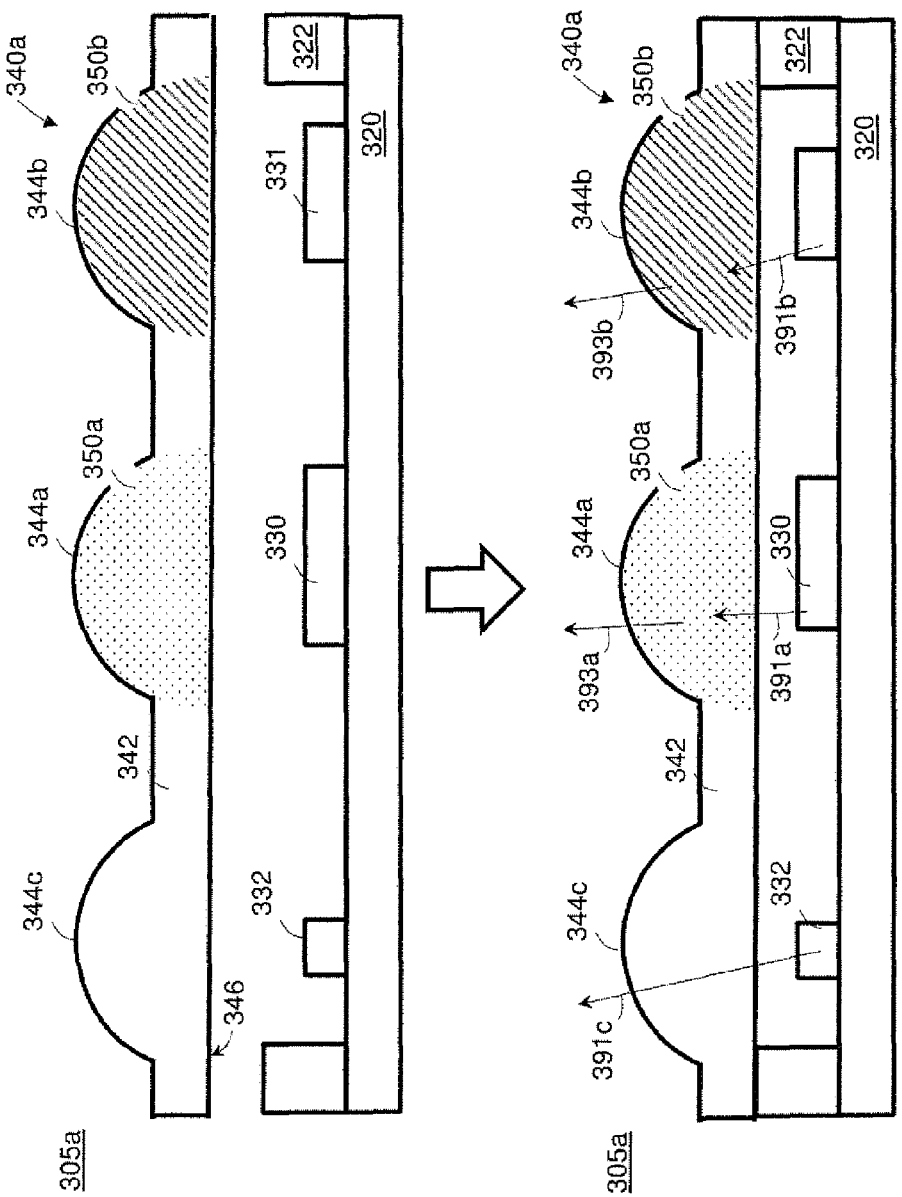
FIGS. 3A and 3B show various views of an alternative system for illumination.
Figure 3B:
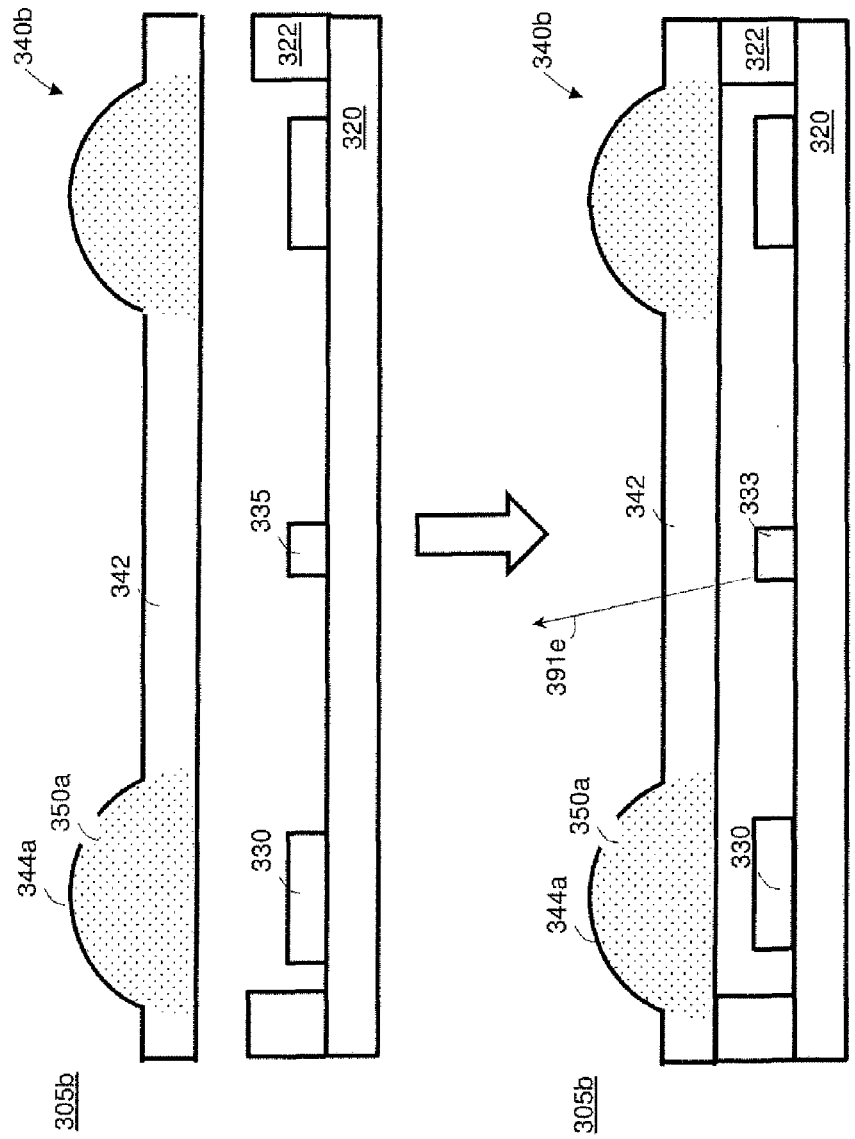
Figure 3C:
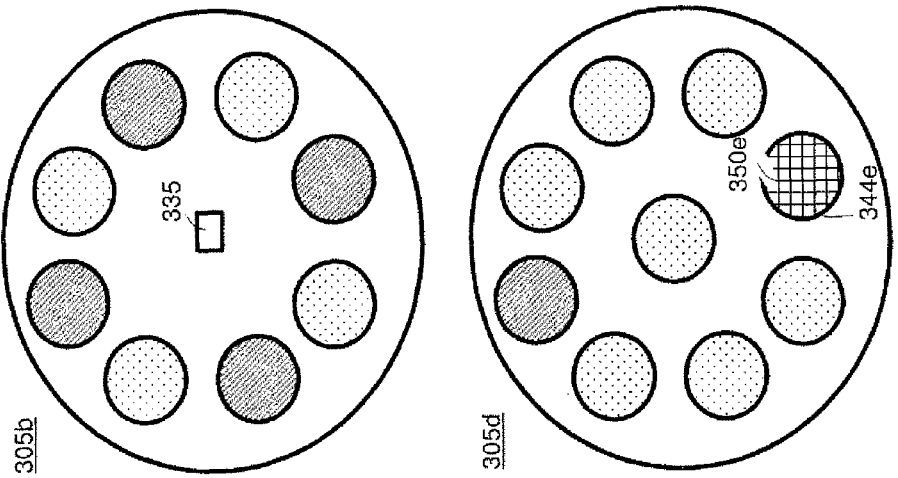
FIG. 3C illustrates top views of casings shown in FIGS. 3A-3B having different spectral converters and top views of two other alternative casings.
Figure 3C:
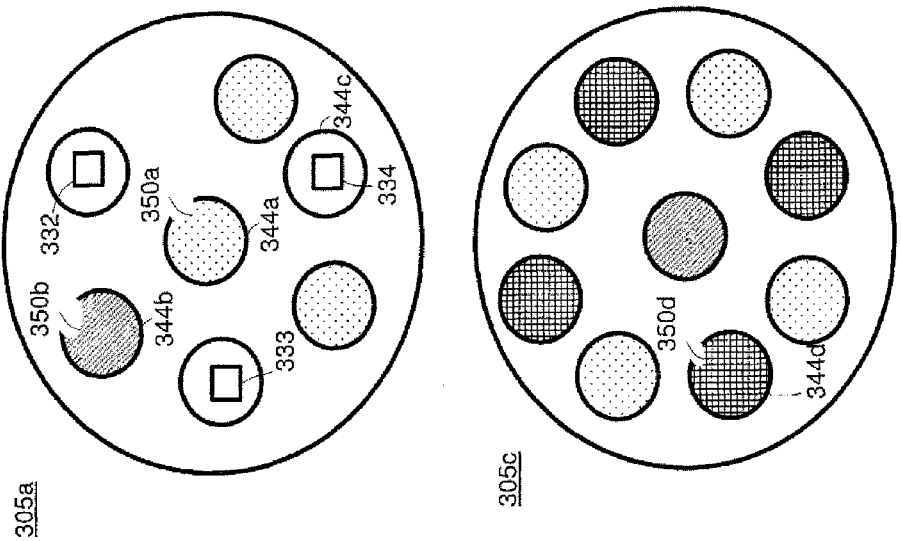

FIGS. 3A-3B show various views of a system 305a, 305b for illumination. More specifically, FIGS. 3A-3B illustrate cross sectional views of the system 305a, 305b having two light-emitting devices 305a, 305b. The top views of the light-emitting devices 305a, 305b and top views of two other alternative light-emitting devices 305c, 305d are shown in FIG. 3C. The two light-emitting devices 305a, 305b may be lighting apparatuses for solid-state lighting with substantially similar form factor. Referring to FIGS. 3A-3C, each of the light-emitting devices 305a may comprise a body 320 with at least one side wall 322, a plurality of light source dies 330-335, a casing 340a,340b and a plurality of spectral converters 350a, 350b.

The body 320 may be a PCB or a molded part. The at least one sidewall 322 may be a portion of the body 320 that is integrated as a single component. Alternatively, the at least one sidewall 322 may be a part that is glued on the body 320. The at least one sidewall 322 may be configured to distance the casing 340a away from the plurality of light source dies 330-335. The casing 340a may comprise a plurality of optical structures 344a-344c. Each member of the plurality of optical structures 344a-344c may comprise a spectral converter 350a, 350b. Optionally, at least one of the plurality of optical structures 344c may be substantially transparent. The casing 340a may have a substantially flat surface 346 for engaging the at least one sidewall 322. The casing 340a may comprise a substantially flat portion 342 interconnecting all the optical structures 344a-344c.

The light-emitting device 305a may comprise at least one primary optical structure 344a having a primary spectral converter 350a, and at least one primary light source die 330 optically coupled to the at least one primary optical structure 344a. The at least one primary light source die 330 may be configured to generate a source spectral output 391a that may be further adjusted into a primary converted spectral output 393a by the primary spectral converter 350a located in the at least one primary optical structure 344a. The primary converted spectral output 393a may contribute substantially to the output of the entire light-emitting device 305a such that the color point of the light-emitting device 305a may be substantially similar to the primary converted spectral output 393a.

The light-emitting device 305a may comprise at least one secondary optical structure 344b having at least one secondary spectral converter 350b and at least one secondary light source die 331. The at least one secondary light source die 331 may be optically coupled to the secondary optical structure 344b. The at least one secondary light source die 331 may be located adjacent to the at least one primary light source die 330 on the body 320. The at least one secondary light source die 331 may be configured to produce a source spectral output 391b substantially similar to a source spectral output 391a. However, the at least one secondary spectral converter 350b in the at least one secondary optical structure 344b may be configured to adjust the source spectral output 391b into a secondary converted spectral output 393b.

In addition, referring to FIGS. 3A-3C, the light-emitting device 305a may further comprise at least one additional secondary light source die 332-334 coupled to the additional optical structures 344c that may be substantially transparent. The at least one additional secondary light source die 332-334 may be configured to emit an additional source spectral output 391c that may be substantially similar (or may be substantially dissimilar) to the source spectral output 391a. In one embodiment, the at least one additional secondary light source die 332-334 may be colored dies configured to emit one of the red, green, blue, cyan, magenta, yellow light. The additional secondary light source die 332 and the substantially transparent optical structure 344c may be optional.

The output of the entire light-emitting device 305a may be a spectral summation of the primary converted spectral output 393a, the secondary converted spectral output 393b and the additional source spectral output 391c. However, the secondary converted spectral output 393b and the additional source spectral output 391c may be substantially smaller in intensity compared to the primary converted spectral output 393a. The primary light source die 330 may be a dominant light source die emitting substantially more light than any one of the other light source dies 331-335. In one embodiment, the at least one primary light source die 330 may be configured to generate approximately 50% more light than any one of the other light source dies 331-335. In order to achieve this, the at least one secondary light source die 331 and the additional secondary light source dies 332-335 may be optionally smaller dies compared to the primary light source die 330. In some embodiments, the light-emitting device 305a may have more or equal number of the primary light source dies 330 and/or the primary optical structures 344a compared to the secondary light source dies 331 and/or the secondary optical structures 344c.

For example, the light-emitting device 305a shown in FIGS. 3A and 3C may comprise three primary light source dies 330 that may be substantially larger than the other light source dies 331-332, such that each of the primary light source dies 330 may be configure to emit at least approximately 30% more light. The primary light source dies 330 and the secondary light source die 331 may be configured to emit blue light whereas the additional secondary light source dies 332-334 may be cyan, magenta and yellow light source dies. The at least one primary optical structure 344a may comprise yellow phosphor configured to produce cool color white light. The secondary optical structure 344b may comprise red phosphor configured to produce warm light. However, the output of the entire light-emitting device 305a may be cool white substantially similar to the primary converted spectral output 393a of the primary optical structure 344a.

The presence of secondary optical structures 344b and secondary light source die 331 and additional light source dies 332-335 may provide additional advantages. For example, the primary converted spectral output 393a may have a first color rendering index. However, spectral summation of all light outputs 393a, 393b and 391c in the entire light-emitting device 305a may have a second color rendering index, which may be higher than the first color rendering index. In addition, having transparent secondary optical structures 344c may provide for use of color light. While white light is often desired for general illumination or lighting purposes, it should be understood that color light may be desired for other special purposes.

The light-emitting device 305b may be substantially similar to the light-emitting device 305a but may differ at least in that the light-emitting device 305b may comprise an additional secondary light source die 335 that may be optically coupled to the substantially flat portion 342 of the casing 340b without going through any of the optical structures 344a. The additional secondary light source die 335 may be a red LED die, which may be configured to emit light for illumination. Optionally, the additional secondary light source die 335 may be for non-illumination purpose such as to indicate a signal of the light-emitting device 305b. The additional secondary light source die 335 may be for visual light communication purposes. In another embodiment, the additional secondary light source die 335 may be configured to emit invisible light such as infra red and ultra violet light.

The light-emitting device 305b in the embodiment shown in FIG. 3B and FIG. 3C may differ from the light-emitting device 305a at least in that the light-emitting device 305b may have substantially the same number of primary optical structures 344a and secondary optical structures 344b, as well as substantially the same number of primary light source dies 330 and secondary light source die 331. However, the output of the light-emitting device 305b may visually appear more similar to the primary converted spectral outputs 393a emitted from the primary optical structures 344a.

Referring to FIG. 3C, the light-emitting device 305c may comprise two types of primary optical structures 344a, 344d with different primary spectral converters 350a, 350d. The light-emitting device 305c may also comprise at least one secondary optical structure 344b having the secondary spectral converter 350b. Both primary optical structures 344a, 344d may contribute substantially towards the light output and the color point of the output of the entire light-emitting device 305c. The two primary optical structures 344a, 344d may be arranged radially, and may be arranged substantially symmetrical, around the secondary optical structure 344b. On the other hand, the light-emitting device 305d may comprise one type of primary optical structure 344a having the primary spectral converter 350a and two different secondary optical structures 344b, 344e having substantially different types of respective secondary spectral converters 350b, 350e.

Figure 4:
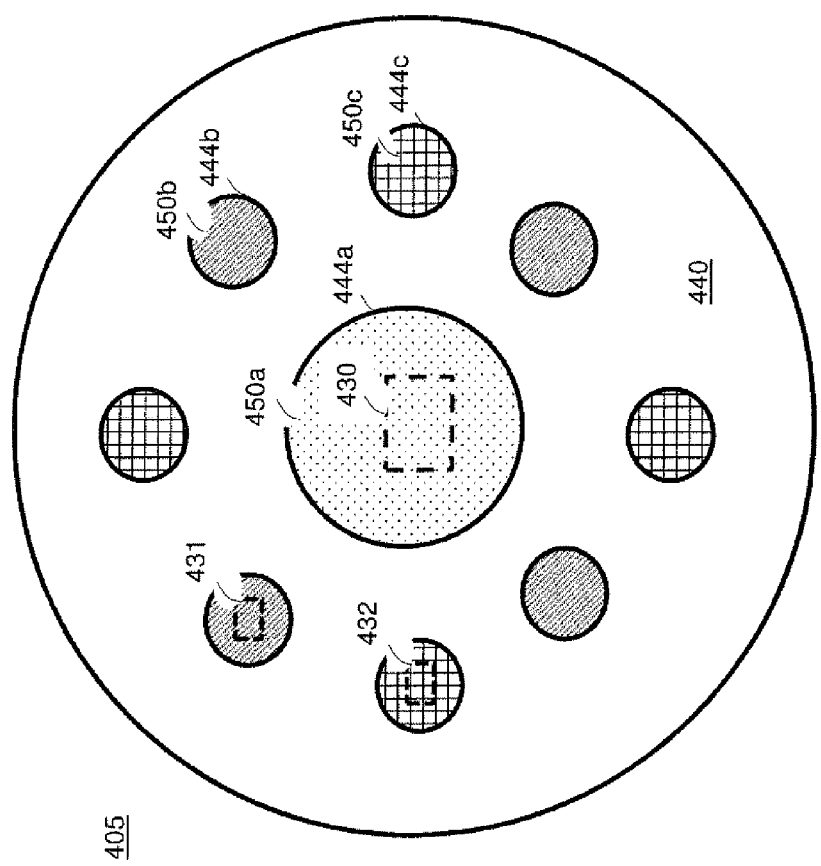
FIG. 4 illustrates a top view of a light-emitting apparatus having a single primary light source die.

FIG. 4 illustrates a top view of a lighting apparatus 405, which may comprise a single primary light source die 430, a primary optical structure 444a, a primary spectral converter 450a, a plurality of secondary light source dies 431, a plurality of additional secondary light source dies 432, a plurality of secondary optical structures 444b, a plurality of additional secondary optical structures 444c, a plurality of secondary spectral converters 450b, a plurality of additional secondary spectral converters 450c, and a casing 440. In the top view of the lighting apparatus 405 shown in FIG. 4, view of the light source dies 430-432 may be blocked by the spectral converters 450a-450c and may not be visible. For illustrative purpose, three of the light source dies 430-432 are shown in dotted lines in FIG. 4. But for the sake of simplicity and ease of illustration, all the other light source dies 430-432 are not shown in FIG. 4.

The lighting apparatus 405 may be substantially similar to the light-emitting device 305a, but may differ at least in that the lighting apparatus 405 may comprise a single primary light source die 430. The primary light source die 430 may be configured to emit approximately 80% of the total light output of the lighting apparatus 405. The primary light source die 430 may be at least 50% larger than any one of the secondary light source dies 431-432 such that the primary light source die 430 may contribute dominantly towards the total light output.

The primary optical structure 444a having the primary spectral converter 450a may be coupled to the single primary light source die 430. The primary optical structure 444a and the primary spectral converter 450a may be arranged proximate to, but may be distanced away from the primary light source die 430 inside the casing 440. Similarly, the plurality of secondary spectral converters 450b, the plurality of additional secondary spectral converters 450c, the plurality of secondary optical structures 444b and the plurality of additional secondary optical structures 444c may be arranged proximate to, but may be distanced away from the plurality of light source dies 431, 432 respectively.

As shown in FIG. 4, the plurality of secondary optical structures 444b and the plurality of additional secondary optical structures 444c may be arranged radially, and may be arranged substantially symmetrical, around the single primary optical structure 444a. The at least one primary optical structure 444a may be at least approximately 50% larger than any one of the plurality of secondary optical structures 444b or the plurality of additional secondary optical structures 444e. In the embodiment shown in FIG. 4, more than one secondary optical structure 444b and more than one additional secondary optical structure 444e are illustrated. However, in another embodiment, the lighting apparatus 405 may comprise one secondary optical structure 444b and/or one additional secondary optical structure 444c, or any other combinations. The lighting apparatus 405 may comprise at least one selected from a group consisting of primary optical structure 444a, one of the plurality of secondary optical structures 444b, the plurality of secondary optical structures 444b, one of the plurality of additional secondary optical structures 444c, the plurality of additional secondary optical structures 444c and combinations thereof.

Figure 5:
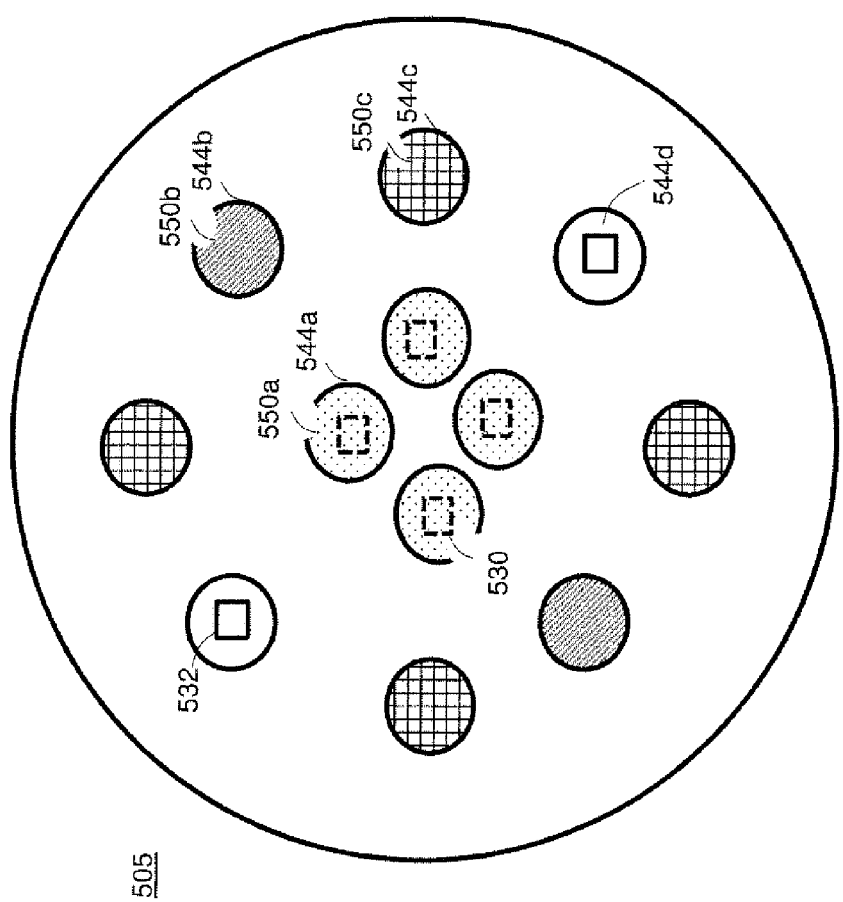
FIG. 5 illustrates a top view of a light-emitting apparatus having multiple primary light source dies.

FIG. 5 shows an embodiment of another lighting apparatus 505, which may be substantially similar to the embodiment shown in FIG. 4, but which may differ at least in one or more of the following points. First, instead of a single primary light source die 430 and a single primary optical structure 444a, the lighting apparatus 505 may comprise a plurality of primary light source dies 530 and may comprise a plurality of primary optical structures 544a, which may have a plurality of primary spectral converters 550a. Second, the primary light source dies 530 may have substantially similar size relative to the secondary light source dies 532. Third, the secondary optical structures 544b-544d may comprise at least one transparent secondary optical structure 544d without any of the secondary spectral converters 550b-550c. Fourth, the secondary optical structures 544b-544d may be arranged radially, and may be arranged substantially symmetrical, to a group of primary optical structures 544a, instead of one primary optical structure 444a as shown in FIG. 4.

Figure 6:
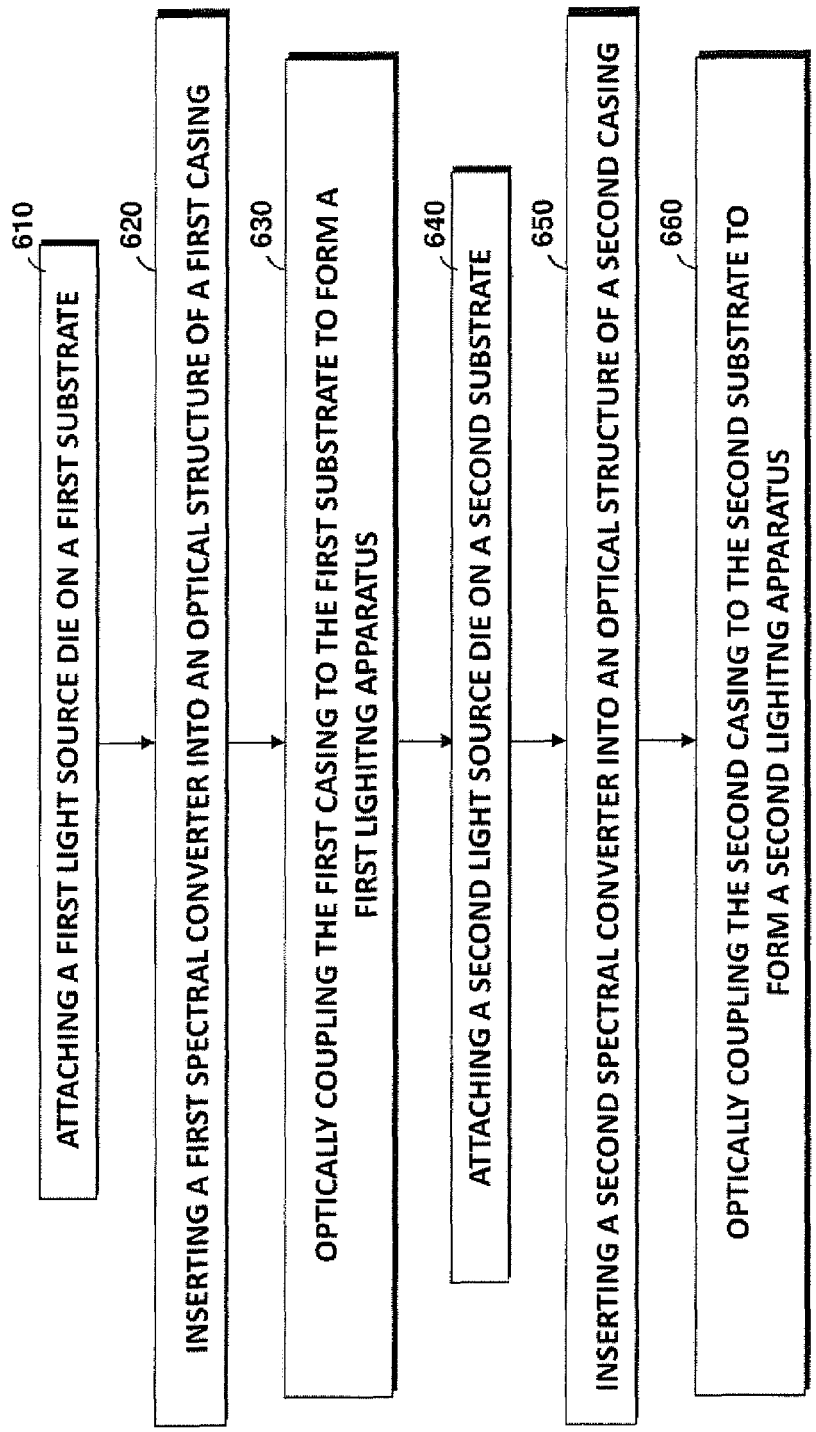
FIG. 6 illustrates a method for making lighting apparatus with different color rendering indexes using one type of light source die.

FIG. 6 illustrates a method for making lighting apparatus with different color rendering indexes using one type of light source die, wherein the one type of light source die may be configured to produce a first spectral output. In step 610, a first light source die may be attached on a first substrate. The method then proceeds to step 620 in which a first spectral converter may be inserted into an optical structure of a first casing. In this step, the first casing may be formed. The first spectral converter may be configured to convert the first spectral output into a first converted spectral output. Optionally, the first spectral converter may be replaced with at least one primary spectral converter and at least one secondary spectral converter.

Next, in step 630, the first casing may be optically coupled to the first substrate to form a first lighting apparatus. In step 640, a second light source die of the one type of light source die may be attached on a second substrate. Similar to step 620, a second spectral converter may be inserted into an optical structure of a second casing during the process of forming the second casing in step 650. The second spectral converter may be configured to adjust the first spectral output into a second converted spectral output. The second converted spectral output may be substantially different from the first converted spectral output. Optionally, the second spectral converter may be replaced with the at least one primary spectral converter, and at least one additional secondary spectral converter that may be substantially different from the at least one secondary spectral converter used in step 620.

In step 660, the second casing may be optically coupled to the second substrate to form a second lighting apparatus. The first and second spectral converters may be selected such that the first and second converted spectral outputs are substantially different to obtain another lighting apparatus having different color rendering index. Steps 610-660 may be repeated to obtain other different lighting apparatuses with different color rendering index by replacing the first and second spectral converters with different types of spectral converters.

Different aspects, embodiments or implementations may, but need not, yield one or more of the following advantages. For example, the arrangement, size, and color selection of primary spectral converter and secondary spectral converter may have effect on color uniformity, color rendering index and appealing look of the lighting device or the lighting apparatus. Another advantage may be that the amount and type of spectral converting material used may increase color rendering index.

Although specific embodiments of the invention have been described and illustrated herein above, the invention should not be limited to any specific forms, combinations or arrangements of parts so described and illustrated. For example, a feature illustrated in one embodiment may be combined into another embodiment. In addition, light source die described above may be LEDs die or some other future light source die as known or later developed without departing from the spirit of the invention. Likewise, although light-emitting devices were discussed, the embodiments are applicable to lighting fixtures, as well as component level light-source packaging to produce light-emitting devices, lighting fixtures or lighting apparatuses. The scope of the invention is to be defined by the claims appended hereto and their equivalents. For example, any claims directed to a light-emitting device shall be construed to be directed to all lighting fixtures, lighting apparatus, and lighting fixtures and vice versa.

What is claimed is:

1. A system for illumination, comprising:
    a plurality of lighting assemblies;
    each member of the plurality of lighting assemblies comprising a respective light source die having a respective source spectral output, and a respective spectral converter selected to adjust a respective portion of the respective source spectral output into a respective converted spectral output;
    wherein the source spectral outputs are substantially similar to human eyes; and
    wherein the spectral converters are selected to be different from one another, and are selected to adjust the source spectral outputs differently into converted spectral outputs that are substantially dissimilar to human eyes.

2. A system as recited in claim 1 wherein each of the plurality of lighting assemblies further comprises a respective casing, and wherein each of the spectral converters is formed within the respective casing and is arranged proximate to the respective light source die.

3. A system as recited in claim 1 wherein each of the spectral converters comprises a respective set of a plurality of spectral converting materials.

4. A system as recited in claim 3 wherein the sets have a plurality of corresponding members of substantially different spectral converting materials, and wherein the corresponding members of substantially different spectral converting materials comprise at least one common spectral converting material that is present in the sets in substantially different amounts.

5. A light-emitting device, comprising:
    a substrate;
    a plurality of light source dies coupled with the substrate and configured to emit substantially similar source spectral outputs;
    a casing coupled to the substrate enclosing at least partially the plurality of light source dies;
    a plurality of spectral converters formed within the casing, the plurality of spectral converters being optically coupled to, but distanced away from, the plurality of light source dies;
    wherein the plurality of spectral converters are configured to adjust the substantially similar source spectral outputs into at least a first converted spectral output and a second converted spectral output that are substantially different to human eyes.

6. A light-emitting device as recited in claim 5 wherein the plurality of spectral converters are configured to adjust the substantially similar source spectral outputs into a third converted spectral output that is substantially different from the first and second converted spectral outputs.

7. A light-emitting device as recited in claim 5 further comprising an alternative casing and a plurality of alternative spectral converters formed within the alternative casing, wherein the plurality of alternative spectral converters are configured to adjust the substantially similar source spectral outputs into at least one alternative converted spectral output that is substantially different from the first and second converted spectral outputs when the alternative casing is optically coupled to the plurality of light source dies and is substituted in place of the casing.

8. A light-emitting device as recited in claim 5 wherein the casing comprises a plurality of optical structures having the plurality of spectral converters.

9. A light-emitting device as recited in claim 8 wherein each member of the plurality of light source dies is configured to be optically coupled to one of the plurality of optical structures respectively.

10. A light-emitting device as recited in claim 9, wherein:
    the light-emitting device further comprises at least one additional colored light source die configured to emit colored source spectral output;

the casing comprises at least one additional substantially transparent optical structure optically coupled to the at least one additional colored light source die.

11. A light-emitting device as recited in claim 8 wherein:
the plurality of optical structures comprises at least one primary optical structure and at least one secondary optical structure;
the at least one primary optical structure is optically coupled with at least one of the light source dies and is configured to transmit a first corresponding portion of the source spectral outputs;
the plurality of spectral converters are selected such that the first corresponding portion of the source spectral outputs is adjusted into the first converted spectral output;
the at least one secondary optical structure is optically coupled with the at least another one of the light source dies and is configured to transmit a second corresponding portion of the source spectral outputs; and
the plurality of spectral converters are selected such that the second corresponding portion of the source spectral outputs is adjusted into the second converted spectral output.

12. A light-emitting device as recited in claim 11 wherein:
the plurality of light source dies comprises at least one dominant light source die optically coupled to the at least one primary optical structure 350*a*; and
the at least one dominant light source die is configured to emit more light relative to any other one of the plurality of light source dies.

13. A light-emitting device as recited in claim 8 wherein each optical structure comprises a cavity, and wherein each optical structure is configured to enclose at least one of the plurality of light source dies within the cavity such that the spectral output from the at least one of the light source dies is transmitted substantially through the respective optical structure.

14. A lighting apparatus, comprising:
at least one primary light source die;
at least one secondary light source die being arranged adjacent to the at least one primary light source die;
a casing;
at least one primary optical structure arranged on the casing proximate to the at least one primary light source die;
at least one secondary optical structure arranged on the casing proximate to the at least one secondary light source die;
a primary spectral converter formed within the at least one primary optical structure;
at least one secondary spectral converter formed within the at least one secondary optical structure;
wherein the at least one primary light source die is configured to emit a primary source spectral output and the at least one secondary light source die is configured to emit a secondary source spectral output that is substantially similar to the primary source spectral output; and
wherein the primary spectral converter is configured to adjust the primary source spectral output of the at least one primary light source die into a primary converted spectral output, and the at least one secondary spectral converter is configured to adjust the secondary source spectral output of the at least one secondary light source die into at least one secondary converted spectral output that is substantially different from the primary converted spectral output.

15. A lighting apparatus as recited in claim 14 wherein:
the primary converted spectral output has a first color rendering index;
the primary converted spectral output and the at least one secondary converted spectral output are mixed to obtain a combined spectral output having a second color rendering index;
the at least one secondary spectral converter is selected such that the second color rendering index is substantially higher than the first color rendering index.

16. A lighting apparatus as recited in claim 15 wherein the casing further comprises at least one substantially transparent portion.

17. A lighting apparatus as recited in claim 16 further comprising an additional secondary light source die optically coupled to the at least one substantially transparent portion of the casing.

18. A lighting apparatus as recited in claim 17 wherein the additional light source die is configured to emit an additional source spectral output that is predominantly light of a single color.

19. A lighting apparatus as recited in claim 18 wherein:
the primary converted spectral output has a first color rendering index; and
the primary converted spectral output and the at least one secondary converted spectral output and the additional source spectral output are all mixed together so as to provide a combined spectral output having a second color rendering index that is substantially higher than the first color rendering index of the primary converted spectral output.

20. A lighting apparatus of claim 19 wherein the primary converted spectral output is at least approximately 50% of the combined spectral output.

\* \* \* \* \*